United States Patent [19]

Houston

[11] Patent Number: 5,208,489
[45] Date of Patent: May 4, 1993

[54] MULTIPLE COMPOUND DOMINO LOGIC CIRCUIT

[75] Inventor: Theodore W. Houston, Dallas County, Tex.

[73] Assignee: Texas Instruments Incorporated, Dallas, Tex.

[21] Appl. No.: 627,562

[22] Filed: Dec. 10, 1990

Related U.S. Application Data

[63] Continuation of Ser. No. 375,097, Jun. 30, 1989, abandoned, which is a continuation-in-part of Ser. No. 903,330, Sep. 3, 1986, abandoned.

[51] Int. Cl.[5] .................. H03K 19/094; H03K 19/20
[52] U.S. Cl. .................................... 307/451; 307/452; 307/480
[58] Field of Search ............... 307/443, 448, 451, 480, 307/263, 452

[56] References Cited

U.S. PATENT DOCUMENTS

| | | | |
|---|---|---|---|
| 4,415,819 | 11/1983 | Mathes | 307/481 |
| 4,710,650 | 12/1987 | Shoji | 307/443 |
| 4,804,867 | 2/1989 | Okitaka et al. | 307/452 |
| 4,849,658 | 7/1989 | Iwamura et al. | 307/452 |
| 4,920,282 | 4/1990 | Muraoka et al. | 307/452 |

OTHER PUBLICATIONS

1981 IEEE ISSC Conference, Feb. 20, 1981 Session XVI, Murphy et al.

IBM Tech. Disc. Bul. vol. 16, No. 2, Jul. 1973 "Dynamic Logic Circuit", Cole et al.
"Ultrafast Compact 32-bit CMOS Adders in Multiple-Output Domino Logic", Hwang & Fisher, IEEE Journal of Solid-State Circuits, vol. 24, No. 2, Apr. 1989, pp. 358-368.
"Tham 11.2: A 3.Ins. 326 CMOS Adder in Multiple Output Domino Logic", Hwang & Fisher, 1988 IEEE International Solid-State Circuits Conference, Thursday, Feb. 18, 1988, pp. 140-141.

*Primary Examiner*—William L. Sikes
*Assistant Examiner*—Margaret Rose Wambach
*Attorney, Agent, or Firm*—Stanton C. Braden; Richard L. Donaldson; Rene E. Grossman

[57] ABSTRACT

A multiple compound CMOS domino circuit (234) is disclosed having a first input section (248) connected to a preliminary dynamic output node (244). A second input section (250) is connected to a preliminary output dynamic node (246) which is independent of the first dynamic node (244). Separate precharge devices (236, 238) precharge the respective dynamic nodes (244, 246) to a desired voltage. Separate discharge transistors (240, 242) operate in conjunction with the respective input sections (248, 250) to discharge the dynamic nodes (244, 246). Static output logic gates (252, 254) include inputs connected to the dynamic nodes (244, 246) and provide multiple outputs of the compound domino logic circuit (234).

27 Claims, 4 Drawing Sheets

MULTIPLE COMPOUND DOMINO LOGIC CIRCUIT

RELATED APPLICATIONS

This application is a continuation of application Ser. No. 375,097 filed Jun. 30, 1989, now abandoned, which is a continuation in part of application Ser. No. 903,330, filed Sep. 3, 1986, now abandoned.

TECHNICAL FIELD OF THE INVENTION

The present invention relates in general to semiconductor circuits, and more particularly relates to domino-type CMOS circuits.

BACKGROUND OF THE INVENTION

A well known technique for simplifying logic is to arrange a number of a plurality of transistors in a logic tree together to simultaneously process digital signals and provide a single output node. The domino-type of logic circuits utilize this technique by cascading plural NMOS input devices to provide selected logic functions. A PMOS transistor is provided, and is clocked to precharge the output node to a predetermined logic state. Depending on the logic state of the inputs of the input devices, the output node remains at the precharged state, or is pulled low through the series-connected devices by a clocked NMOS device connected to ground. In accordance with the logic NAND function, if all of the NMOS input devices are driven by a logic high level, an output node of the domino circuit will be a logic low. Conversely, if any one of the input NMOS devices is driven with a logic low, the output node of the domino circuit will remain at its precharged logic high state. Because an inversion function is performed with this arrangement, an inverter is generally utilized at the output of the domino circuit to perform an additional logic inversion function so that an overall AND function is realized.

While the domino-type of logic circuit provides a speed advantage, as well as reduced wafer area, this logic family is susceptible to a severe drawback. Because the domino-type of logic is dynamic, i.e., relies on the sustained logic state by charging the parasitic capacitances of the output node, the finite charge precharged at the node must be distributed to each input NMOS device to charge the drain-source capacitance of each such device. When the number of cascaded NMOS input devices becomes large, a number of turned on input devices may cause the output node to become significantly discharged. When this occurs, the output of the inverter can change state, even though not all of the input NMOS devices have been driven into conduction. An erroneous logic output is thereby produced which is contrary to the logic AND function which specifies that a high output is produced when all of the inputs are driven to the same logic high state.

The number of input devices, and thus the number of domino inputs, is thereby limited. This can be appreciated as the voltage drop at the circuit output node increases as more cascaded input NMOS devices are driven into conduction. The problem noted above exists when a number of NMOS devices adjacently connected to the output node are turned on, and one or more others are not. Of course, when all input NMOS devices are driven into conduction, the output node is driven to a logic low which satisfies the AND function.

A multiple-output domino logic, known as MODL, allows single logic trees to produce multiple outputs. Thus, MODL avoids replication of circuitry, where possible, by adding precharge devices and static inverters at intermediate nodes of the logic tree to obtain a desired subfunction.

While precharging an intermediate node of a logic tree may somewhat reduce charge sharing, capacitance is added to the tree resulting in reduced speed. Further, the additional capacitive loading necessitates larger pull-down devices to discharge the capacitance, thereby increasing the size of the device.

From the foregoing, it can be seen that a need exists for an improved multiple output domino logic circuit having reduced capacitive loading. Moreover, a concomitant need exists for an improved domino logic family which is yet even higher in speed, and which may be fabricated in a smaller wafer area.

SUMMARY OF THE INVENTION

In accordance with the present invention, the disclosed compound domino circuit reduces or eliminates the disadvantages and shortcomings associated with the prior art circuits.

According to the multiple compound domino logic, plural NMOS input transistors are split into multiple sections, each section providing a separate preliminary output node. Thus, each cascaded section processes respective input logic signals to produce independent preliminary outputs. The preliminary output node of each section is connected to static logic gates which logically combine the signals of the preliminary outputs to produce multiple circuit outputs according to the logic function desired.

The present invention provides the technical advantage of producing multiple outputs from a single domino logic circuit without adding capacitance in a way which would slow the circuit. The resulting circuit has increased speed and is less prone to charge-sharing as compared to prior art circuits The utilization of the present invention does not preclude the use of conventional feedback techniques to provide quasi-static operation at the precharged node.

BRIEF DESCRIPTION OF THE DRAWINGS

Further features and advantages will become more apparent from the following and more particular description of the preferred embodiment of the invention, as illustrated in the accompanying drawings in which like reference characters generally refer to the same parts throughout the views, and in which.

DETAILED DESCRIPTION OF THE INVENTION

Figures 1, 2:
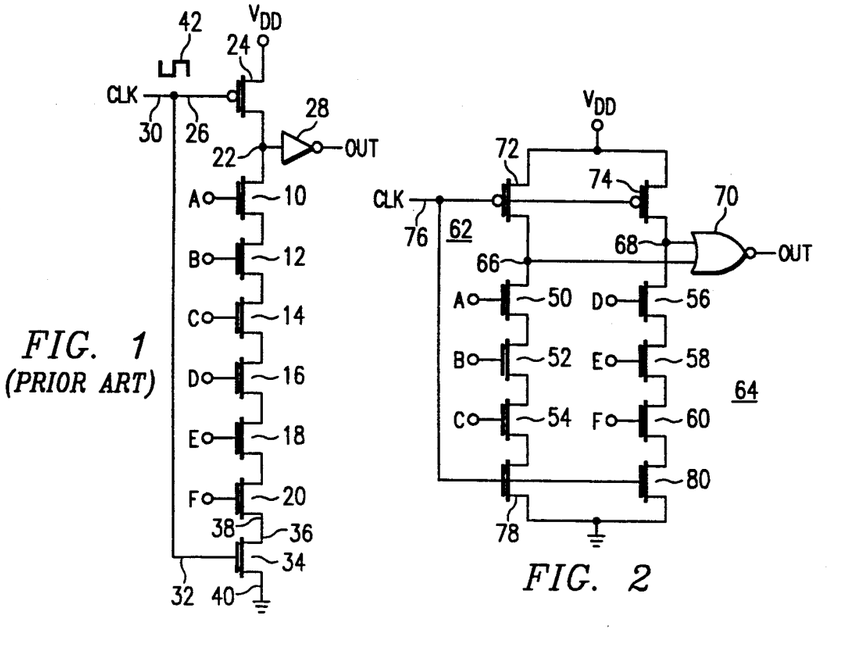
FIG. 1 is a schematic diagram of a conventional six-input domino logic AND circuit known in the art.
FIG. 2 is a compound domino logic circuit constructed to provide a logic AND function.

The operation of conventional CMOS domino circuits is better understood by referring first to FIG. 1. A conventional six-input CMOS domino circuit is shown with corresponding six input transistors 10-20. The input transistors 10-20 are generally NMOS (NMOS) enhancement mode devices, each associated with and connected to a respective input A-F. Thus, when a logic high is applied to any one of the circuit inputs A-F, the associated input transistor 10-20 is turned on, e.g., a conduction channel is formed between the source and drain terminal of the respective transistor. Each input transistor 10-20 is connected to the others in what is known as a cascaded arrangement.

An output indication of the conduction of all transistors 10-20 can be determined at node 22. Node 22 is also connected to a P channel (PMOS) transistor 24 which is connected to a supply voltage Vdd. When the P channel transistor 24 is driven into conduction, such as by a logic low voltage on the gate input 26, the supply voltage is coupled through the transistor 24 and is applied to the node 22. The node is thus precharged to a logic high voltage. According to the conventional operation of MOS circuits, when the precharge transistor 24 is turned off, the node 22 will remain precharged to the supply voltage until each transistor of the input transistor string 10-20 is driven into conduction. An inverter 28 is connected between node 22 and the output of the domino circuit for providing the complement of the signal appearing at such node.

In accordance with the conventional operation of CMOS domino circuits, a clock input 30 is connected to the gate 26 of precharge transistor 24, as well as to the gate 32 of an NMOS discharge transistor 34. The drain 36 of transistor 34 is connected to the source 38 of the bottom input transistor 20. The source 40 of transistor 34 is connected to ground. Thus, when a logic high is applied to the gate 32, transistor 34 is driven into conduction, thereby grounding the source 38 of input transistor 20.

In performing the logic AND function, the logic low part of the precharge clock signal 42 is applied to the clock input 30. The PMOS precharge transistor 24 is driven into conduction, thereby precharging node 22 to a Vdd voltage level. During the low portion of the precharge clock 42, a discharge transistor 34 is nonconductive. During the logic high part of the precharge clock signal 42, the PMOS precharge transistor 24 is rendered nonconductive, and the NMOS discharge transistor 34 is made conductive. As noted above, the source of input transistor 20 is held to a logic low when a clock signal is high. It is during the logic high part of the precharge clock signal 42 that digital signals are applied to the domino circuit inputs A-F. In the event that six logic high signals are applied to the inputs A-F, the respective input transistors 10-20 as will be turned on and the conducting discharge transistor 34 will pull node 22 to a logic low. The inverter 28 inverts the logic low at node 22 and provides an output logic high to the circuit output. An AND logic function is thereby realized.

The CMOS domino circuit of FIG. 1 may be especially susceptible to a false output when, for example, inputs A-E are driven to logic high levels, while input F remains at a logic low level. In this situation, the AND logic function should not be realized as transistor F is nonconductive, and thus the discharge transistor 34, even though conductive, is electrically isolated from input transistor 18. However, with transistors 10-18 driven into conduction, the voltage with which node 22 is precharged functions as a source of voltage and begins charging the drain-source capacitances of each conducting transistor 10-18. Depending upon the amount of drain-source capacitance, and the number of series transistors conducting (five in the example), the voltage at node 22 can drop to such an extent that the inverter 28 switches the output of the circuit to a logic high. This, of course, is an erroneous output as not all of the inputs A-F have been driven to a logic high level. The present invention remedies this shortcoming and thus provides a more reliable circuit operation.

An improved CMOS compound domino circuit is illustrated in FIG. 2. For purposes of illustration and comparison with the prior art, the CMOS domino circuit of FIG. 2 includes six inputs and provides a logical AND function. Departing from conventional practices, the inputs are separated into independent sections, with inputs A-C operating as a first section, and inputs D-F operating as a second section. Input transistors 50-54 are associated with the respective inputs A-C, while input transistors 56-60 are associated with inputs D-F. Transistors 50-54 comprise the input transistor section or stage 62, while transistors 56-60 comprise the second input section 64.

The first and second input transistor sections 62 and 64 each include a respective preliminary output node 66 and 68 which operate independently of each other. The preliminary output nodes 66 and 68 are connected to the inputs of a static NOR gate 70. The output of the NOR gate 70 comprises the output of the compound domino circuit.

In order to insure the independent operation of input transistor sections 62 and 64, two PMOS precharge transistors 72 and 74 are connected between the supply voltage Vdd and the respective preliminary output nodes 66 and 68. Each gate input of the PMOS precharge transistors 72 and 74 is driven by a precharge clock input 76. The precharge clock (CLK) input 76 also drives the gates of a pair of NMOS transistors 78 and 80 which are connected between ground and the bottommost transistors 54 and 60 of the respective sections 62 and 64.

As can be seen from the compound domino circuit of FIG. 2, if input transistor 54 of the first section 62 is not conducting, the preliminary output node 66 must provide a charge capability for at most the two transistors 50 and 52. Similarly, if input transistor 60 associated with input F of the second input section 64 is nonconducting, the preliminary output node 68 must charge the drain-source capacitances of only the two input transistors 56 and 58. The charge sharing problem between drain-source capacitances for a given charge stored at the preliminary output nodes is thereby reduced. The erroneous output due to the excessive discharge of the circuit node is also eliminated, without reducing the total number of inputs to the logic circuit.

Not only is the reliability of the compound domino circuit improved, but the speed of the circuit can also be increased. By this it is meant that with fewer series transistors to turn on, the logic state of each section 62 and 64 can be established at the respective preliminary output node 66 and 68 faster than at the corresponding node 22 of FIG. 1.

The use of the compound logic circuit of FIG. 2 is similar to that of the prior art, in that a low clock signal is applied to the CLK input 76 to drive the precharge transistors 72 and 74 into conduction. The supply voltage Vdd thereby charges the preliminary output nodes 66 and 68 to a predetermined state. A precharge clock signal transition from a logic low to a logic high turns off precharge transistors 72 and 74, and drives discharge transistors 78 and 80 into conduction. A near ground voltage is thus applied to the source terminals of respective input transistors 54 and 60. During the application of the logic high precharge clock to the input 76, logic high signals applied to the first set of input transistors 50-54 will cause the preliminary node 66 to be driven to a logic low. If, on the other hand, any one of the inputs A-C is at a logic low, the preliminary output node 66 will remain at the precharged high level.

Although the input transistors 56-60 of the second section 64 operate independently of those of the first section 62, the logical operation is identical. Thus, during a true logic AND function where all the inputs A-F are at logic highs, the preliminary output nodes 66 and 68 will be driven to logic low levels. With two logic low signals applied to the NOR gate 70, the output of the domino circuit will be driven to a logic high level. A similar analysis can be conducted to understand that if any one input A-F remains at a logic low level, the output of the NOR gate 70 will remain at a logic low level. The compound logic circuit of FIG. 2 therefore provides an overall logic AND function.

While various compound domino logic circuits disclosed herein are provided with a discharge transistor associated with each input section, such arrangement is not necessary to the principals of the invention. For example, a single discharge transistor could be connected to both input transistors 54 and 60 to provide a discharge path to ground to both input sections 62 and 64.

Figures 3, 4:
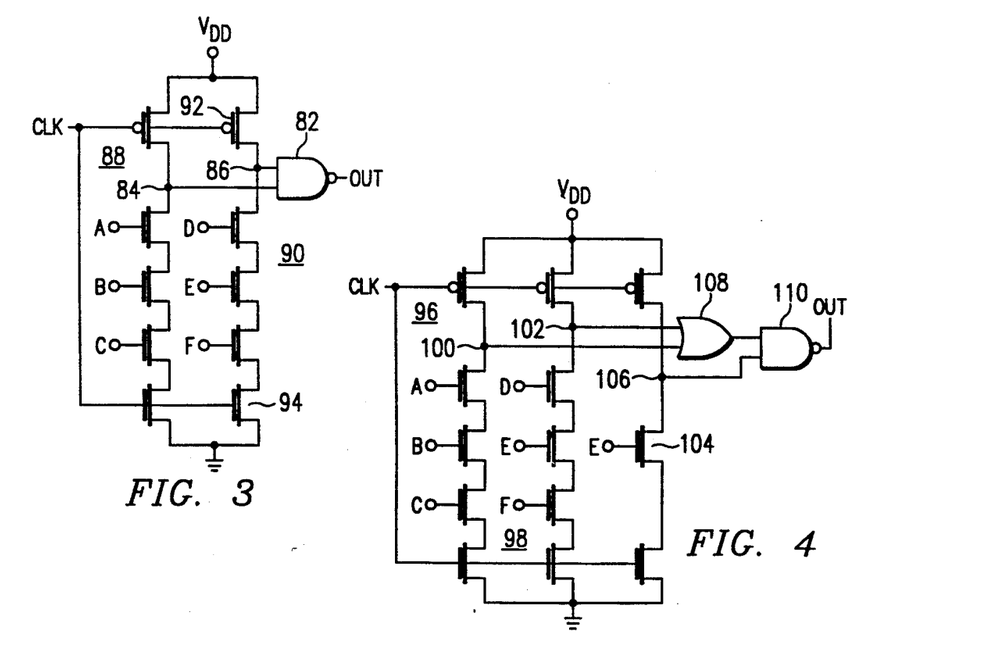
FIG. 3 is another embodiment of a compound domino logic circuit embodying a logical OR function.
FIG. 4 is an embodiment illustrating a three-section compound domino circuit.

FIG. 3 illustrates a compound domino logic circuit which provides a logic function equivalent to a conventional dual three-input domino circuit having a common precharged node. A conventional practice in extending the number of inputs in prior domino circuits is to connect additional input transistor sections to the node 22 (FIG. 1). The charge sharing problems noted above are further aggravated by resort to this technique FIG. 3 illustrates a compound domino circuit with a first input transistor section 88 associated with inputs A-C, and a second section 90 with associated inputs D-F. In the compound domino circuit of FIG. 3, the charge sharing problem is not exacerbated by the addition of a second section 90. This is because the preliminary output nodes 84 and 86 of the respective sections 88 and 90 are independently charged by respective precharge transistors. Thus, the additional drain-source capacitances added by the second input transistor section 90 do not share the charge of the preliminary output node 84 of the first section. Rather, a new preliminary output node 86 is formed to operate with the second input transistor section 90, together with a PMOS precharge transistor 92 and a discharge transistor 94. The logic function provided by the compound domino logic of FIG. 3, and the equivalent conventional common node domino circuit can be expressed as:

$$OUT = ABC + DEF$$

FIG. 4 illustrates yet another implementation of a compound domino logic for replacing conventional domino type circuits. The conventional domino logic circuit which operates in an equivalent logic manner is a six-input AND string with a single additional input connected in common to the circuit node. As noted above in connection with FIG. 2, the six-input AND string is reduced to two independently operated sections 96 and 98 driving respective preliminary output nodes 100 and 102. The conventional common node input is provided by input transistor 104 associated with input G, connected to a third preliminary output node 106. Node 106 is electrically independent from nodes 100 and 102. Charge sharing between the input transistors of sections 96 and 98 and that of transistor 104 is not degraded by the addition of input transistor 104. The static NOR gate 108 is connected to preliminary output nodes 100 and 102 to provide the AND function with regard to inputs A-F. The output of the NOR gate 108 is connected to one input of a NAND gate 110, as is the preliminary output node 106. The output of the circuit of FIG. 4 is the result of a logical AND operation over inputs A-F ORed with the input G.

Figure 5:
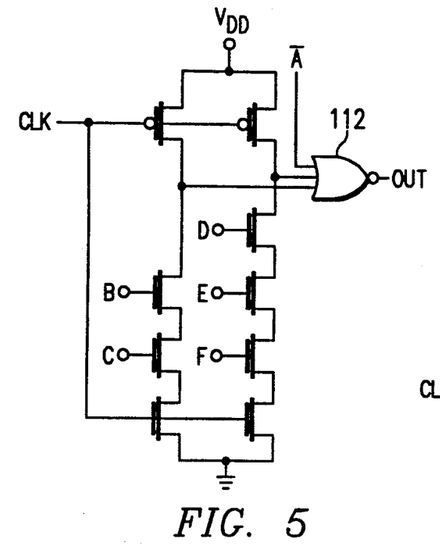
FIG. 5 is a schematic drawing illustrating the application of an input to the domino logic circuit directly to the static logic circuit of the compound domino circuit.

The compound domino logic circuit of FIG. 5 illustrates another important advantage of compound domino logic. The use of this circuit presents a technical advantage in those instances where the complement of an input signal is available In the noted circuit, inputs B-F are available as true logic signals, while the input A is available in its complement form. Hence, the complement of the signal A is applied to the output NOR gate 112. The circuit of FIG. 5 is similar to FIG. 2, but does not include an input transistor for the A digital signal, but rather applies the complement of the A signal to an additional input of the output NOR gate 112. Since the static logic gate 112 is a multiple input device, the necessity of an additional input is not unduly burdensome and does not require substantial wafer area. Since most logic circuits process the true signals, as well as the complement, the circuit of FIG. 5 can be very beneficial in that the input transistor count of domino circuits can be reduced, and thus the wafer area necessary for fabrication can also be reduced. The propogation delay of the circuit can also be reduced, in that the input signal is applied directly to the static output device and need not propogate through an input transistor. The elimination of an input transistor also reduces the charge sharing problem.

Figure 6:
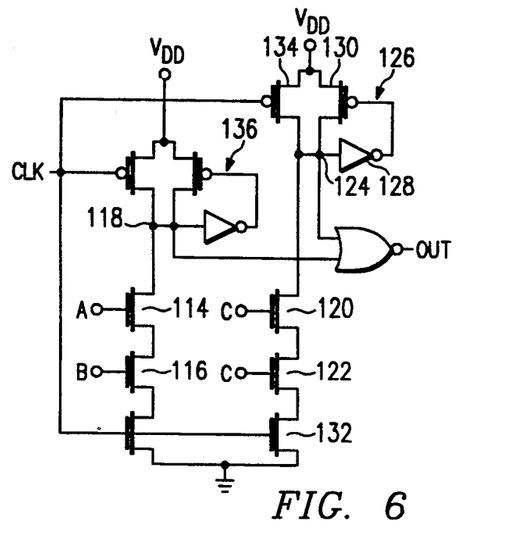
FIG. 6 illustrates the use of feedback in a compound domino logic circuit to achieve quasi-static operation.

FIG. 6 is a compound domino logic circuit comprising a four-input AND structure with positive feedback to provide quasi-static operation. Input transistors 114 and 116, associated with inputs A and B, drive the preliminary output node 118. Input transistors 120 and 122, associated with inputs C and D, drive the preliminary output node 124. A feedback network 126 comprising a static inverter 128 driving a PMOS precharge transistor 130 is connected to the preliminary output node 124.

The feedback network 126 assures that the preliminary output node 124 remains at a static logic high level so that the precharged voltage thereat is not eventually discharged through the high resistance semiconductor substrate. The preliminary output node 124 is initially precharged to a logic high by the clocked PMOS precharge transistor 134. If one or both of the input transistors 120 or 122 is not driven into conduction by a corresponding input, the preliminary output node 124 should remain at a logic high. The precharged logic high at node 124 is applied to the input of the inverter 128, and inverted to a logic low which is applied to the gate of the precharge PMOS transistor 130. The precharge transistor 130 is thus driven into conduction, coupling the supply voltage $V_{dd}$ back to the preliminary output node 124. Thus, for logic high levels, the preliminary output node 124 has been transformed from a dynamic node to a static node.

In the event that both input transistors 120 and 122 are driven into conduction by logic high signals applied to the respective C and D inputs thereof, the preliminary output node 124 will be driven to a logic low through such input transistors and the clocked ground reference transistor 132. The inverter 128 will drive the precharge transistor 130 with a logic high, thereby turning it off. As a result, the voltage supply Vdd is isolated from the preliminary output node 124 by the cut-off transistor 130. The technical advantage afforded this arrangement is that a static current drain through the circuit is prevented when the preliminary output node 124 is discharged to a logic low. Of course, with a logic high applied to both inputs C and D, the state of the preliminary output node 124 is controlled by the state of the CLK. When the CLK signal is high, the PMOS precharge transistor 134 is cut off, and the preliminary output node 24 will be drawn to a logic low through input transistor 120 and 122 and the discharge transistor 132. When the CLK input is low, the precharge transistor 134 will be driven into conduction.

Under these conditions, the preliminary output node will be precharged to a logic high level. The removal of the supply voltage from the preliminary output node 124 during logic low states is important so that a static current drain from the supply voltage $V_{dd}$ to ground is eliminated. The feed back network 136 associated with preliminary output node 118 operates in a similar manner.

Figure 7:
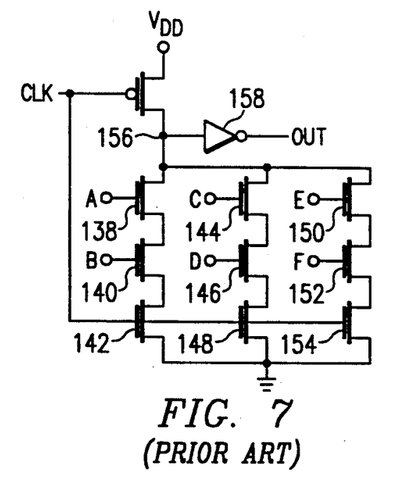
FIG. 7 is a schematic drawing of a conventional six-input domino logic OR circuit known in the art.

FIG. 7 illustrates a conventional CMOS domino circuit providing the logic function:

$$AB+CD+EF=OUT.$$

The circuit is characterized by a pair of input transistors 138 and 140 associated with inputs A and B, and connected through a discharge transistor 142 to ground. Another pair of input transistors 144 and 146 are connected through another discharge transistor 148 to ground. A third pair of input transistors 150 and 152 are connected through a third discharge transistor 154 to ground. The drain terminal of each input transistor 138, 144 and 150 are connected in common to an internal node 156. The current sharing problem of the circuit of FIG. 7 is apparent. Should input transistors A, C and E be driven into conduction, even though transistors B, D and F are cut off, the transient current charging the drain-source capacitance can decrease the precharged voltage at node 156 sufficiently to change the output state of the inverter 158. On the occurrence of this condition, the circuit operates erroneously, thus providing an output not satisfying the foregoing logic equation.

Figure 8:
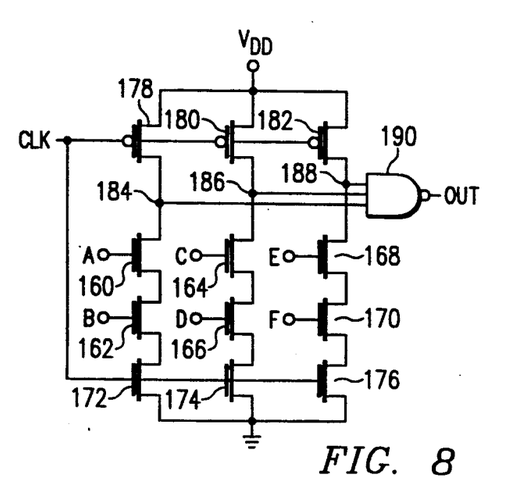
FIG. 8 is a compound domino logic circuit constructed to provide a logic OR function.

The compound domino logic circuit of FIG. 8 overcomes the charge sharing problem. The compound domino logic circuit of FIG. 8 includes a pair of input transistors 160 and 162, each associated with a respective input A and B. A second pair of input transistors 164 and 166 are associated with respective inputs C and D. Lastly, a third pair of input transistors 168 and 170 are associated with a respective input E and F. The source terminals of input transistor 162, 166 and 170 are each connected to the drain terminal of a respective discharge transistor 172, 174 and 176. The drain terminal of input transistor 160 is connected to the source terminal of an associated PMOS precharge transistor 178. Input transistors 164 and 168 are comparably connected to respective PMOS precharge transistors 180 and 182. The provision of the three precharge transistors 178-182 enables each noted pair of input transistors to be connected to a respective preliminary output node 184, 186 and 188. A CLK input is connected to the gate terminal of each precharge transistor, as well as the gate terminal of each discharge transistor.

In order to produce an output in accordance with the equation noted with respect to the circuit of FIG. 7, a three-input NAND gate 190 is connected to the three preliminary output nodes 184-188. The output of the static NAND gate 190 provides the output of the domino logic circuit The three preliminary output nodes 184-188 are electrically isolated from each other, and are precharged by respective precharge transistors 178-182. As a result, the drain-source capacitances required to be charged are not only isolated, but also are provided with separate precharging sources, e.g., the precharge transistors 178-182 The provision of the NAND gate 190 connected to the three preliminary output nodes 184-188 preserves the operation in accordance with the noted equation, previously provided by the common node connection of the prior art circuit.

The multiple output compound domino logic circuit of the present invention is best understood by referring to FIGS. 9-14. The present invention improves on the circuits described in connection with FIGS. 1-8 by providing a plurality of logic functions from a single circuit without adding capacitance which would slow the circuit.

Figure 9A:
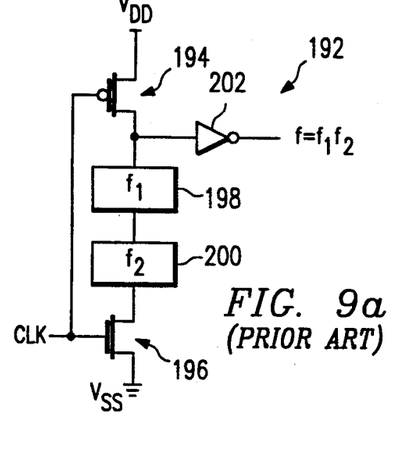
FIGS. 9a–c illustrate block diagrams of prior art domino logic structures.
Figure 9B:
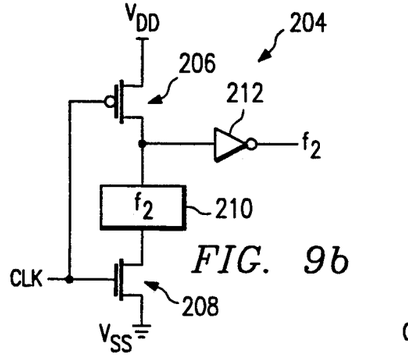
Figure 9C:
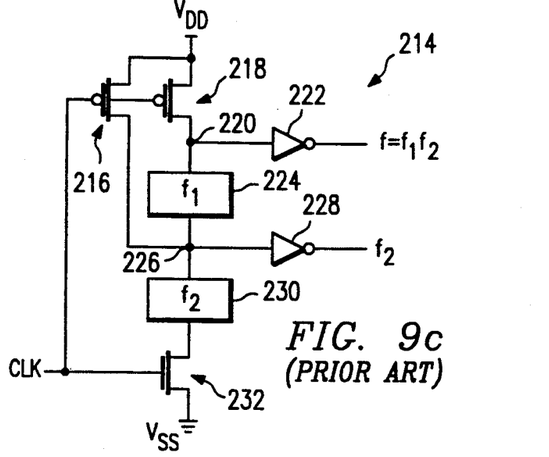

FIGS. 9a-c illustrate prior art circuits for implementing multiple logic gates. FIGS. 9a and 9b illustrate two circuits which would be necessary using domino logic to provide two logic functions: (1) $f = f_1 f_1$ and (2) $f_2$. For example, if $f_1 = AB$ and $f_2 = CD$, then $f = ABCD$.

In FIG. 9a, a circuit to implement the function $f = f_1 f_2$ is illustrated. The circuit 192 comprises a P channel transistor 194 and an NMOS transistor 196 connected to functional blocks 198 and 200. An inverter 202 is connected to the drain of the PMOS transistor 194. The inverter 202 outputs the logical function $f = f_1 f_2$.

The functional blocks 198 and 200 comprise a plurality of NMOS transistors used to implement the function. For example, $f_1 = AB$ and $f_2 = CD$, then functional block 198 would comprise two NMOS transistors respectively connected to inputs A and B and functional block 200 would comprise two NMOS transistors having gates connected to C and D. Using simple compound logic, however, the function $f_2$ is not available by itself; therefore, the circuit of FIG. 9b is also needed to implement the function $f_2$.

FIG. 9b illustrates a circuit used to implement the function $f_2$. The circuit 204 comprises a P channel transistor 206 and an NMOS transistor 208 connected to a functional block 210. An inverter is connected to the drain of the PMOS transistor 206. The output of the inverter 212 provides the function $f_2$. The functional block 210 would comprise the same circuitry as would the functional block 200 in FIG. 9a.

In order to reduce redundant circuitry, the prior art MODL circuit shown in FIG. 9c can be used to provide the same logic gates as FIGS. 9a and 9b. The circuit 214 comprises two PMOS transistors 216 and 218, each having a source connected to $V_{dd}$. The drain of PMOS transistor 218 is connected to a node 220. The node 220 is connected to an inverter 222 and a functional block 224 representing the function $f_1$. The functional block 224 is connected to a node 226, which is also connected to an inverter 228, a functional block 230 representing the function $f_2$, and the drain of the PMOS transistor 216. Functional block 230 is also connected to the drain of an NMOS transistor 232 having its source connected to ground and its gate connected to the gates of the P channel transistors 216 and 218, as well as the CLK signal.

In operation, the MODL circuit 214 precharges both nodes 220 and 226. The logic function $f_2$ may be obtained at node 226 through inverter 228 and the logic function f may be obtained at node 220 through inverter 222. Hence, the repetitive circuitry of FIGS. 9a and 9b is avoided.

However, the circuit 214 of FIG. 9c has serious shortcomings. The added precharge device at intermediate node 226 in the logic tree represented by functional blocks 224 and 230 increases the capacitive load of the logic tree. The added capacitive load results in a reduced speed for the circuit 214 and necessitates a larger pulldown device to discharge the capacitance, thereby increasing the size of the device.

Figure 10:
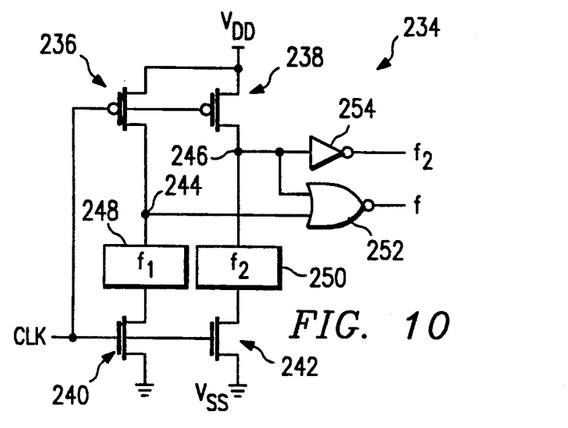
FIG. 10 illustrates a block diagram of the multiple compound domino logic of the present invention.

FIG. 10 illustrates a block diagram of an embodiment of the present invention which may be used to implement the circuit 214 of FIG. 9c, without the added capacitance associated therewith. The circuit 234 comprises PMOS precharge transistors 236 and 238 and NMOS discharge transistors 240 and 242, each having gates connected to a CLK signal. The sources of the P channel transistors 236 and 238 are connected to $V_{dd}$, and the drains of the PMOS transistors 236 and 238 are connected to nodes 244 and 246, respectively. The sources of NMOS transistors 240 and 242 are connected to $V_{ss}$, and the drains of NMOS transistors 240 and 242 are connected to function blocks 248 and 250, respectively. Nodes 244 and 246 are connected to function blocks 248 and 250, respectively, and the inputs of a NOR gate 252. Node 246 is also connected to an inverter 254. The output of the inverter 254 provides the $f_2$ and the output of NOR gate 252 provides the f function.

As can be seen from FIG. 10, $f_1$ and $f_2$ are split into separate logic trees, thereby avoiding the necessity of precharge an intermediate node in a logic tree. The independent functional blocks may be combined using a NOR gate 252 to implement the function f.

Figure 11A:
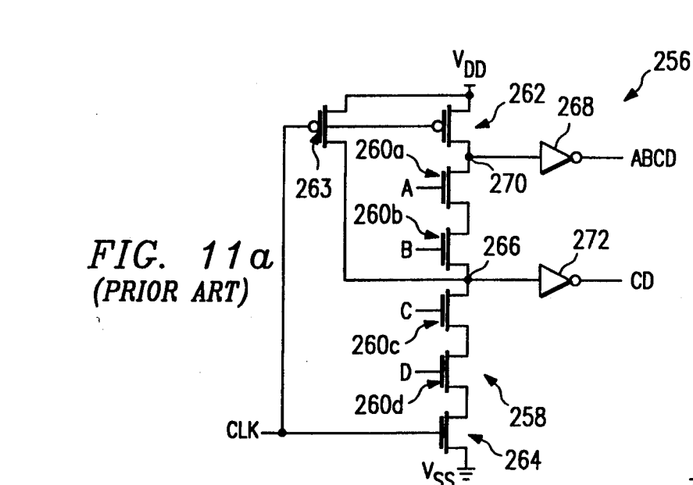
FIGS. 11a–b illustrate schematic representations of a circuit formed using multiple output domino logic and of a circuit using the multiple compound domino logic of the present invention.
Figure 11B:
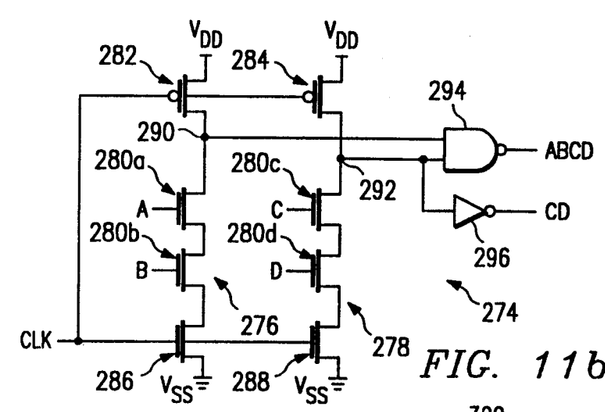

The inventive concepts of the present invention are best understood by comparing two functionally identical circuits, the first shown in FIG. 11a using a MODL design and the second shown in FIG. 11b using the multiple compound domino logic of the present invention. The circuits in FIGS. 11a-b both receive four inputs A, B, C, and D, and generate two outputs, ABCD and CD.

The MODL circuit 256 of FIG. 11a comprises a single logic tree 258 including four NMOS transistors 260a-d. The gates of the NMOS transistors 260a-d are connected to the respective inputs A-D. A CLK signal is connected to the gates of a PMOS precharged transistor 262, and NMOS discharge transistor 264 and a node 266 intermediate to the transistors 260b and 260c. A first inverter 268 is connected to a node 270 at the drain of PMOS transistor 262. The output of inverter 268 is the logic function ABCD. A second inverter 272 is connected to node 266. The output of second inverter 272 is the logic function CD.

In operation, the precharge transistors 263 and 262 will precharge nodes 266 and 270, respectively, when the CLK signal is low. If both CD and ABCD are logically true, a path between node 270 and $V_{ss}$ will exist, discharging the nodes 266 and 270. Notably, for the output of the inverter 268 to be high, both the charge at 266 and the charge at node 270 must be discharged through NMOS transistor 264. Consequently, approximately twice as much charge must be dissipated by the NMOS transistor 258 than would be the case for a single logic tree without the intermediate node 266. Further, no charge will be dissipated from node 270 until the voltage at node 266 is at least one voltage threshold below the voltage present on the gate of transistor 260b. This results in even slower response time of the circuit.

FIG. 11b illustrates a multiple compound domino logic circuit 272 which produces the same logical outputs as the circuit of FIG. 11a. Circuit 274 comprises two logic trees 276 and 278. Logic tree 276 comprises two NMOS transistors 280a-b and logic tree 278 comprises two NMOS transistors 280c-d. Inputs A-D are connected to the gates of respective transistors 280a-d. PMOS precharge transistors 282 and 284 and N channel discharge transistors 286 and 288 have gates connected to the CLK signal. The sources of PMOS transistors 282 and 284 are connected to $V_{dd}$ and the drains of PMOS transistors 282 and 284 are connected to nodes 290 and 292, respectively. Nodes 290 and 292 are connected to the drains of NMOS transistors 280a and 280c, respectively. NMOS discharge transistor 286 has a source connected to $V_{ss}$, and a drain connected to the source of NMOS transistor 280b. Similarly, N channel discharge transistor 288 has a source connected to $V_{ss}$ and a drain connected to the source of NMOS transistor 280d. Nodes 290 and 292 are connected to the input of a NOR gate 294; node 292 is also connected to the input of an inverter 296. The NOR gate outputs a logical signal ABCD and the inverter 296 outputs the logical signal CD.

In operation, nodes 290 and 292 are precharged when the CLK signal is low. Upon a transition of the CLK signal from low to high, nodes 290 and 292 will be discharged simultaneously (assuming ABCD=true), resulting in a faster transition time. Furthermore, the charge at node 292 is not affected by the charge on the source of transistor 280b, as was the case for the circuit of FIG. 11a. Hence, the circuit of FIG. 11b is faster and more reliable than the circuit of FIG. 11a.

Figure 12:
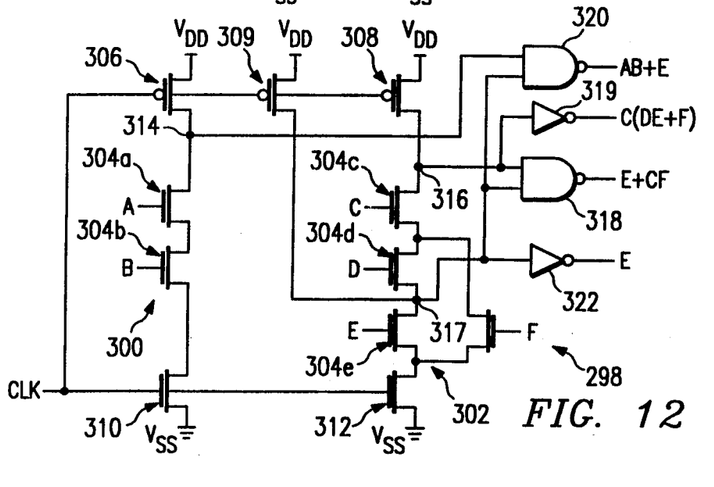
FIG. 12 illustrates a schematic representation of a multiple compound domino logic circuit using multiple outputs from a single tree.
Figure 13:
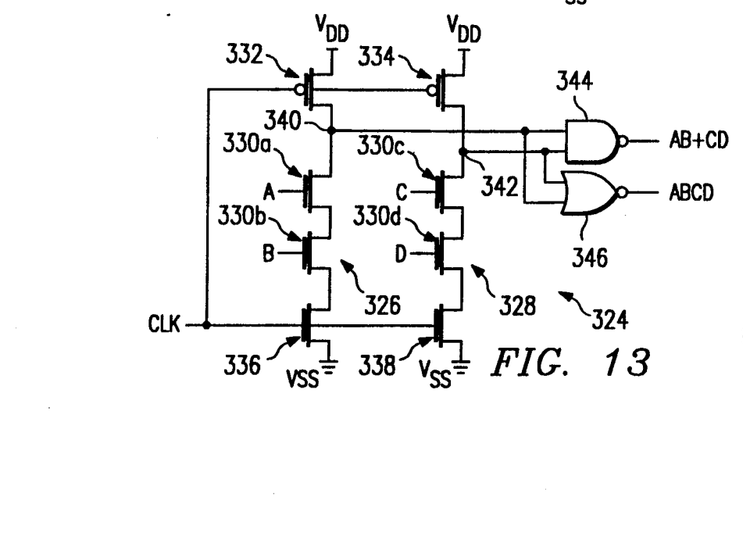
FIG. 13 illustrates a schematic representation of a multiple output domino logic circuit using multiple logic combinations of the individual trees.
Figure 14:
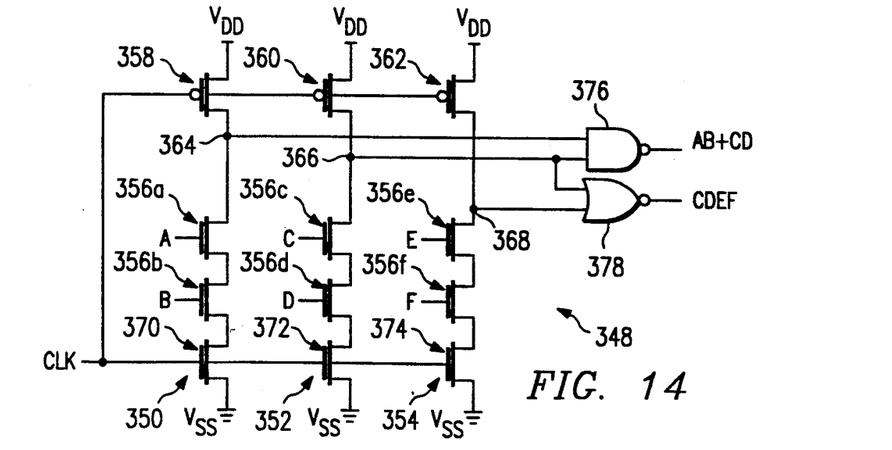
FIG. 14 illustrates a schematic representation of a multiple compound domino logic circuit using more than two logic trees.

FIGS. 12-14 illustrate additional embodiments in which the present invention may be used. FIG. 12 illustrates a schematic representation of a circuit in which multiple outputs from a single tree are used with compound logic. The circuit 298 comprises two logic trees 300 and 302. Logic tree 300 comprises transistors 304a–b having gates connected to inputs A and B, respectively. Logic tree 302 comprises three NMOS transistors 304c–f having gates connected to inputs C-F, respectively. NMOS transistor 304f is connected in parallel to NMOS transistors 304d and 304e. PMOS precharge transistors 306, 308 and 309 and NMOS discharge transistors 310 and 312 each having gates connected to the CLK signal. PMOS transistors 306, 308 and 390 have sources connected to $V_{dd}$ and drains connected to nodes 314, 316, and 317, respectively. N channel transistors 310 and 312 have sources connected to $V_{ss}$ and drains connected to transistors 304b and 304e, respectively. Nodes 316 and 317 (between NMOS transistors 304d and e) are connected to the inputs of NAND gate 318. Node 316 is also connected to inverter 319. Node 314 is connected to the input of NAND gate 320. Node 317 is connected to inverter 322 and NAND gate 320.

The circuit 298 provides four logic outputs: AB+E, C(DE+F), E+CF and E. The four outputs are provided using two logic trees 300 and 302, logic tree 302 having two nodes 316 and 317 used for output determination. Since logic tree 302 uses an intermediate node 317, the circuit should only be used when the timing requirements allow the extra capacitance of the internal node.

While the additional node 317 does not improve the speed of the circuit, it allows additional logic function to be obtained from a single logic tree, thereby providing increase functionality from the same circuit space. The circuit of FIG. 12 provides multiple logic outputs from a single tree, including logic outputs which depend on two or more nodes of the same logic tree. The circuit of FIG. 12 also provides a logic output which depends on nodes from more than one logic tree, where at least one of the nodes is an intermediate node.

FIG. 13 illustrates a schematic representation of a multiple compound domino logic circuit in which there are multiple logic combinations of the individual trees. The circuit 324 has two logic trees 326 and 328. Logic tree 326 comprises NMOS transistors 330a–b and logic tree 328 comprises NMOS transistors 330c–d. NMOS transistors 330a–d have gates connected to input signals A-D, respectively. The CLK signal is connected to the gates of PMOS precharge transistors 332 and 334 and N channel discharge transistors 336 and 338. PMOS transistors 332 and 334 have sources connected to $V_{dd}$ and drains connected to logic trees 326 and 328, respectively, at nodes 340 and 342. NMOS transistors 336 and 338 have sources connected to $V_{ss}$ and drains connected to logic trees 326 and 328, respectively. Nodes 340 and 342 are connected to the inputs to AND gate 344 and to the inputs of NOR gate 346.

By connecting different logical gates, such as NAND gate 344, to the nodes of the various logic trees, the multiple compound domino logic may be used to provide multiple logical functions from the same set of input sections, thus reducing area and loading on input signals compared to the prior art. In the illustrated embodiment, NAND gate 344 provides the logical function AB+CD while NOR gate 346 provides the logical function ABCD. Other logical gates, such as AND, OR, XOR and XNOR, could be used as well as the logic gates shown.

FIG. 14 illustrates a schematic representation of a circuit having three logic trees. Circuit 348 comprises three logic trees 350, 352 and 354. Each logic tree comprises two N channel transistors. Logic tree 350 comprises NMOS transistors 356a–b, logic tree 352 comprises NMOS transistors 356c–d, and logic tree 354 comprises NMOS transistors 356e–f. PMOS transistors 358, 360 and 362 have gates connected to the CLK signal, sources connected to $V_{dd}$, and drains connected to nodes 364, 366 and 368, respectively. Nodes 364, 366 and 368 are also connected to the drains of NMOS transistors 356a–c and 356e. NMOS transistors 370, 372 and 374 have gates connected to the CLK signal, sources connected to $V_{ss}$ and drains connected to the sources of NMOS transistors 356b, d and f. Nodes 364 and 366 are connected to the inputs of NAND gate 376. Node 366 and 368 are connected to the input of NOR gate 378.

The circuit 348 of FIG. 14 uses more than two logic trees such that each logic tree is smaller, thereby providing a faster response time. Further, an increase in the number of logic trees may be utilized to provide a desired logic function without resort to internal nodes.

Although the present invention has been described in detail, it should be understood that various changes, substitutions and alterations can be made herein without departing from the spirit and scope of the invention as defined by the appended claims. In particular, whereas the present invention has been described in terms of a CMOS technology, it could also be used with NMOS, bipolar and other technologies.

What is claimed is:

1. A compound domino logic circuit for providing a plurality of logic outputs based on a plurality of logic inputs, comprising:
    a plurality of electrically isolated input logic sections, each of said input logic sections for receiving at least one logic input, and each of said input logic sections including a preliminary node defining an output of the respective section;
    a plurality of clocked precharge devices, each of said clocked precharge devices connected to one of said preliminary nodes for precharging said preliminary nodes to a first voltage;
    one or more clocked discharge devices connected to said plurality of electrically isolated input logic sections for referencing each of said input logic sections to a second voltage level;
    a first output logic device connected directly to at least one of said preliminary nodes including a first preliminary node for providing a first logic output; and
    a second output logic device connected directly to two or more of said preliminary nodes for providing a second logic output wherein one of said two or more preliminary nodes is said first preliminary node.

2. The compound domino logic circuit of claim 1 wherein said first output logic device comprises a NOR gate.

3. The compound domino logic circuit of claim 2 wherein said second output logic device comprises an inverter.

4. The compound domino logic circuit of claim 1 wherein said first output logic device comprises a NAND gate.

5. The compound domino logic circuit of claim 1 wherein one of said electrically isolated input logic sections includes an intermediate node defining a second output of said one section, connected to one of said output logic devices.

6. The compound domino logic circuit of claim 1 wherein said precharge device comprises a PMOS transistor.

7. The compound domino logic circuit of claim 1 wherein said discharge device comprises an NMOS transistor.

8. The compound domino logic circuit of claim 1 wherein said logic sections each comprise one or more NMOS transistors having a drain region connected in series with a discharge device.

9. The compound domino logic circuit of claim 8 wherein at least one of said logic section comprises one or more NMOS transistors connected in parallel to one or more of said NMOS transistors connected in series.

10. A compound domino logic circuit for providing a plurality of logic outputs, comprising:
a first section comprising at least one transistor to provide a current path from a first preliminary dynamic output node to a first discharge node, and said transistor including an input to said compound domino logic circuit;
a second input section comprising at least one transistor to provide a current path from a second preliminary dynamic output node to a second discharge node, said second preliminary dynamic output node being electrically independent of said first preliminary dynamic output node;
at least a pair of clocked precharge transistors, each of said precharge transistors connected between a supply voltage and one of said first and second preliminary dynamic output nodes;
one or more clocked discharge transistors connected to said discharge nodes;
a first logic gate having inputs connected directly to said first and second preliminary dynamic output nodes, and an output comprising a first output of said compound logic circuit; and
a second logic gate having at least one input connected directly to at least one of said first and second preliminary dynamic output nodes, and an output comprising a second output of said compound logic circuit.

11. The compound domino logic circuit of claim 10 and further comprising a third input section comprising at least one transistor to provide a current path from a third preliminary output dynamic node to a third discharge node, said third preliminary dynamic node being electrically independent of said first and second preliminary dynamic output nodes.

12. The compound domino logic circuit of claim 11 wherein said first logic gate is further connected to said third preliminary node.

13. The compound domino logic circuit of claim 11 wherein said second logic gate is further connected to said third preliminary node.

14. The compound domino logic circuit of claim 10 wherein said transistors comprising the first and second input sections comprise NMOS transistors.

15. The compound domino logic circuit of claim 10 wherein said precharge transistors comprise PMOS transistors.

16. The compound domino logic circuit of claim 10 wherein said discharge transistors comprise NMOS transistors.

17. A method of providing a plurality of logic outputs comprising:
applying input logic signals to a plurality of logic sections, each said input logic section defining a preliminary node;
precharging said preliminary nodes responsive to a first clock orientation;
discharging said preliminary nodes responsive to a second clock orientation and to the applied input signals;
generating a first logic output responsive to the voltages present at at least one of said preliminary nodes including a first preliminary node; and
generating a second logic output responsive to the voltage present at two or more preliminary nodes, wherein one of said two or more preliminary nodes is the same as said first preliminary node used in the step of generating said first logic output.

18. The method of claim 17 wherein said step of generating a first logic output comprises the step of performing a logical NOR operation on the voltages present at said first set of nodes.

19. The method of claim 17 wherein said step of generating a second logic output comprises the step of performing a logic inversion operation on the voltages present at said second set of nodes.

20. An integrated circuit including:
a compound domino logic circuit for providing a plurality of logical outputs based on a plurality of logical inputs, comprising:
a plurality of electrically isolated input logic sections, each said second for receiving at least one logical input, and each said section including a preliminary node defining an output of the respective section;
a plurality of clocked precharged devices, each of said precharge devices connected to one of said preliminary nodes for precharging said nodes to a first voltage;
one or more clocked discharge devices connected to said plurality of input logic sections referencing each said section to a second voltage level;
a first output logic device connected directly to at least one of said preliminary nodes including a first preliminary node for providing a second logic output; and
a second output logic device connected directly to two or more of said preliminary nodes for providing a second logical output wherein one of said two or more preliminary nodes for providing a second logical output is said first preliminary node.

21. The integrated circuit of claim 20 wherein said first output logic device comprises a NOR gate.

22. The integrated circuit of claim 21 wherein said second output logic device comprises an inverter.

23. The integrated circuit of claim 20 wherein said first output logic device comprises a NAND gate.

24. A compound domino logic circuit for providing a plurality of logic outputs based on a plurality of logic inputs comprising:
an input logic section for receiving a plurality of inputs, said logic section including a plurality of nodes defining preliminary logic outputs;

a plurality of clocked precharge devices, each of said clocked precharge devices connected to one of said nodes for precharging said nodes to a first voltage;

a clocked discharge device for referencing said logic section to a second voltage level;

a first output logic device connected directly to at least one of said nodes including a first node to provide a first logic output; and a second output logic device connected directly to two or more of said nodes for providing a second logic output wherein one of said two or more nodes for providing a second logic output is said first node.

25. The compound domino logic circuit of claim 24 wherein said second output logic device comprises a NAND gate.

26. The compound domino logic circuit of claim 24 wherein said second output logic device comprises a NOR gate.

27. The compound domino logic circuit of claim 24 wherein said first output logic device comprises an inverter.

* * * * *